United States Patent
Park

(10) Patent No.: US 7,787,168 B2
(45) Date of Patent: Aug. 31, 2010

(54) DISPLAY DEVICE AND METHOD FOR FABRICATING THE SAME

(75) Inventor: Seung-Kyu Park, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 234 days.

(21) Appl. No.: 11/834,318

(22) Filed: Aug. 6, 2007

(65) Prior Publication Data

US 2008/0030833 A1    Feb. 7, 2008

(30) Foreign Application Priority Data

Aug. 7, 2006    (KR) .................... 10-2006-0074209

(51) Int. Cl.
  *G02F 1/03*    (2006.01)
  *G02F 1/1335*    (2006.01)
  *G09G 3/36*    (2006.01)

(52) U.S. Cl. ................ 359/259; 359/245; 349/106; 349/108; 349/109; 349/114; 349/144; 345/87; 345/88; 345/211; 430/7; 438/30

(58) Field of Classification Search ............... 359/245, 359/248–250, 253–255, 259; 349/12, 38, 349/40, 46, 48, 88, 106, 108, 109, 114, 129, 349/139, 141, 144, 155, 187; 345/77, 87, 345/88, 100, 211, 690, 694; 438/29, 30, 438/149; 430/7; 313/504; 347/107; 445/24

See application file for complete search history.

(56) References Cited

U.S. PATENT DOCUMENTS

| | | | | |
|---|---|---|---|---|
| 5,818,550 A | * | 10/1998 | Kadota et al. ............... | 349/43 |
| 5,943,107 A | * | 8/1999 | Kadota et al. ............... | 349/44 |
| 6,016,178 A | * | 1/2000 | Kataoka et al. ............. | 349/117 |
| 6,710,827 B2 | * | 3/2004 | Kubo et al. ................ | 349/55 |
| 6,836,300 B2 | * | 12/2004 | Choo et al. ................ | 349/43 |
| 7,016,005 B2 | * | 3/2006 | Koike ....................... | 349/144 |
| 7,206,050 B2 | * | 4/2007 | Chae ........................ | 349/141 |
| 7,209,107 B2 | * | 4/2007 | Ohmuro et al. ............. | 345/92 |
| 7,212,266 B2 | * | 5/2007 | Tashiro et al. .............. | 349/114 |
| 7,239,367 B2 | * | 7/2007 | Jin et al. .................... | 349/159 |
| 7,248,314 B2 | * | 7/2007 | Yun ........................... | 349/108 |
| 7,280,174 B2 | * | 10/2007 | Park et al. .................. | 349/114 |
| 7,292,294 B2 | * | 11/2007 | Hung et al. ................. | 349/106 |
| 7,335,919 B2 | * | 2/2008 | Koo et al. ................... | 257/72 |
| 7,388,630 B2 | * | 6/2008 | Shin et al. .................. | 349/109 |

(Continued)

FOREIGN PATENT DOCUMENTS

JP    2004280111    10/2004

(Continued)

*Primary Examiner*—Loha Ben
(74) *Attorney, Agent, or Firm*—H. C. Park & Associates, PLC

(57) ABSTRACT

The present invention provides a display panel of a flat panel display device of a four-color structure in which color mixture may not occur in a white sub-pixel and a method for fabricating the same. The display device includes first, second, third, and fourth sub-pixels, and each sub-pixel includes a thin film transistor. A color filter is formed adjacent to the thin film transistor of each of the first, second, and third sub-pixels, a planarization layer is formed on the color filters, and a pixel electrode is connected to each thin film transistor.

25 Claims, 13 Drawing Sheets

U.S. PATENT DOCUMENTS

| | | | |
|---|---|---|---|
| 7,442,566 B2 * | 10/2008 | Ohmuro et al. | 438/30 |
| 7,599,035 B2 * | 10/2009 | Park et al. | 349/141 |
| 2003/0071943 A1 * | 4/2003 | Choo et al. | 349/106 |
| 2007/0153197 A1 * | 7/2007 | Park et al. | 349/141 |
| 2007/0268433 A1 * | 11/2007 | Moon et al. | 349/114 |
| 2008/0074587 A1 * | 3/2008 | Tien et al. | 349/106 |
| 2008/0143897 A1 * | 6/2008 | Chang | 349/33 |

FOREIGN PATENT DOCUMENTS

| | | |
|---|---|---|
| KR | 1020050015026 | 2/2005 |
| KR | 1020050070256 | 7/2005 |

* cited by examiner

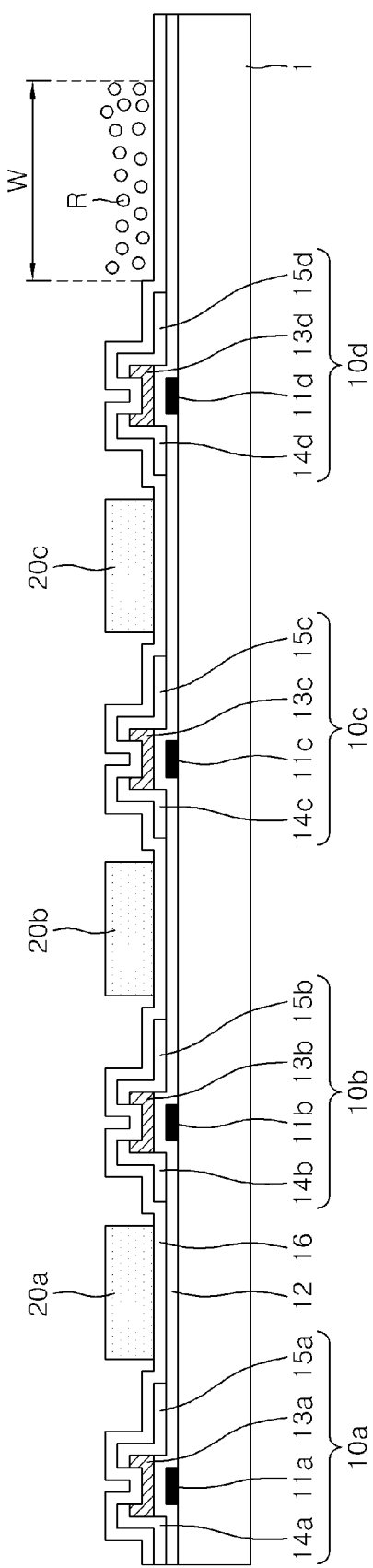

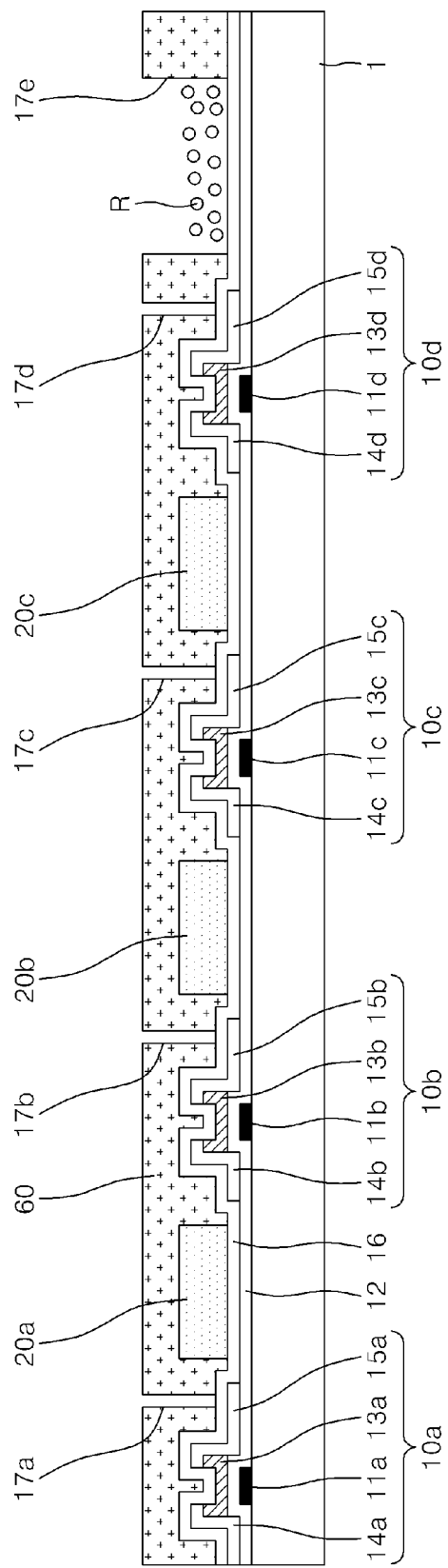

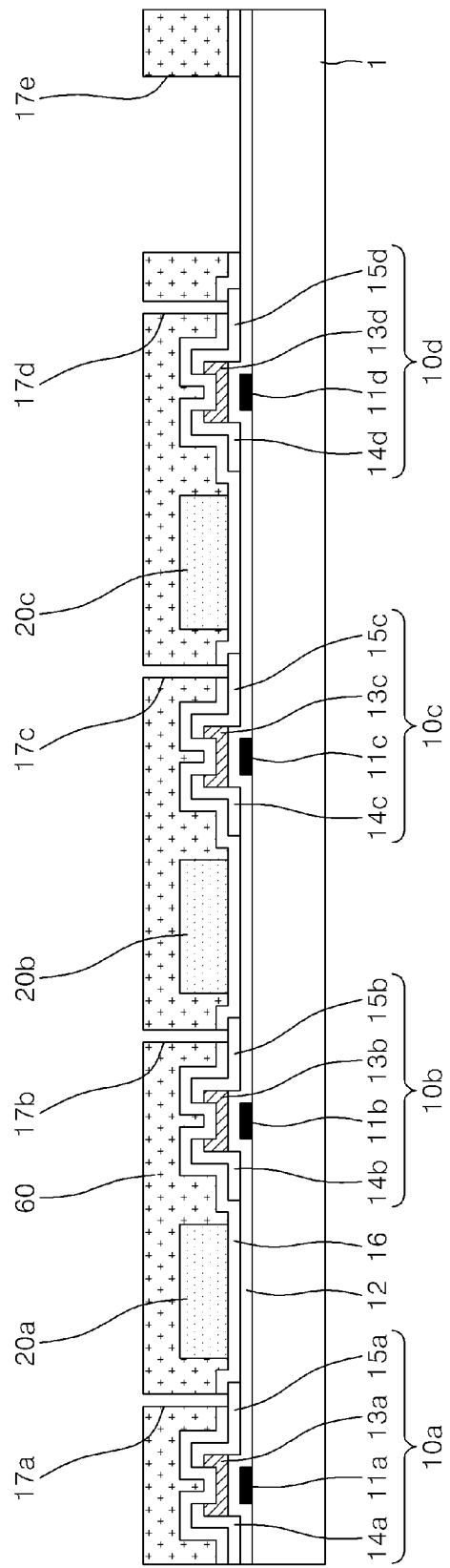

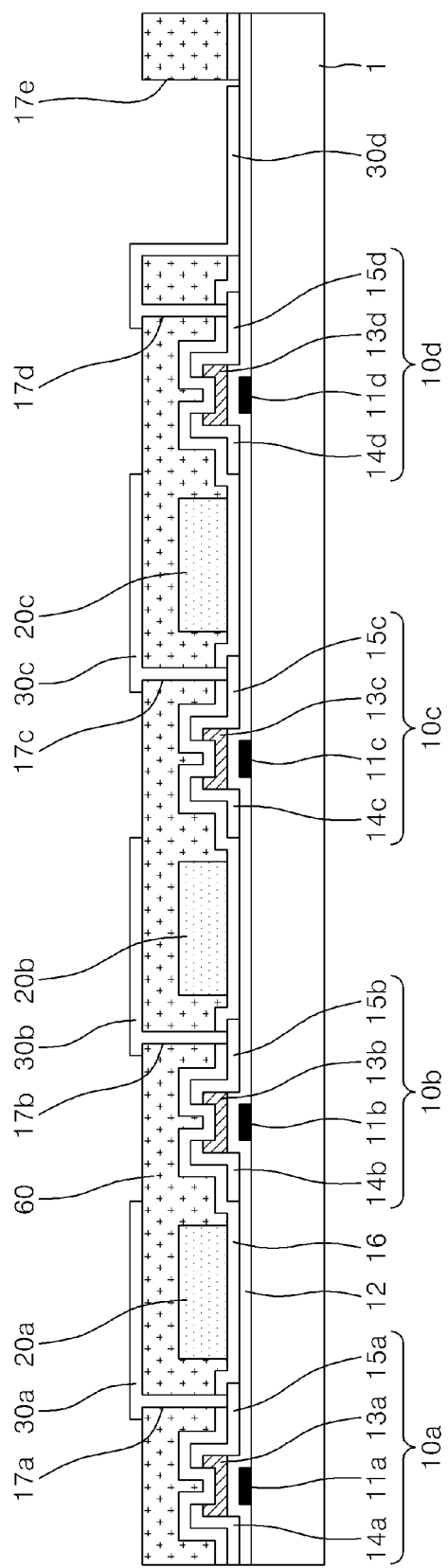

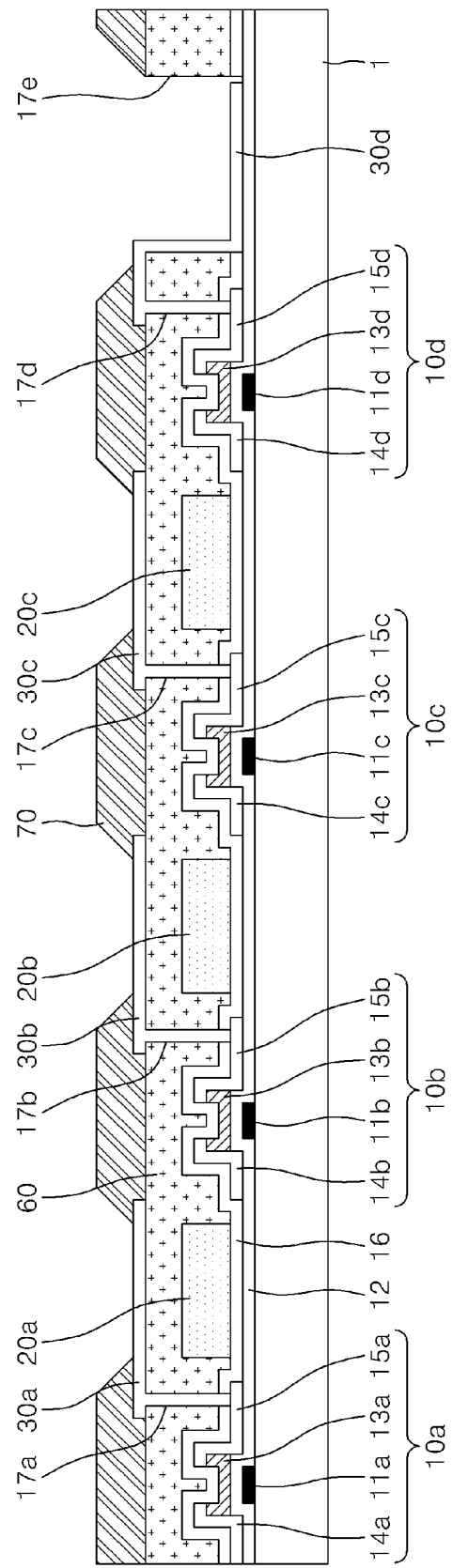

DISPLAY DEVICE AND METHOD FOR FABRICATING THE SAME

CROSS-REFERENCE TO RELATED APPLICATION

This application claims priority from and the benefit of Korean Patent Application No. 10-2006-0074209, filed on Aug. 7, 2006, which is hereby incorporated herein for all purposes as if fully set forth herein by reference.

BACKGROUND OF THE INVENTION

1. Field of Invention

The present invention relates to a display device and a method for fabricating the same and, more particularly, to a display device of a four-color structure in which color mixture may not occur in a white sub-pixel and a method for fabricating the same.

2. Discussion of the Background

With the development of information and telecommunication technology, the demand for electronic display devices has increased, resulting in the introduction of various display devices. In order to satisfy the various demands of the information age, electronic display devices are being introduced that provide a large viewing area and high performance, while being relatively inexpensive and maintaining a thin, compact design.

Flat panel display devices, such as a liquid crystal display ("LCD"), a plasma display panel ("PDP"), and an organic light-emitting diode ("OLED") display, are becoming more prevalent in the electronic display market. In particular, research and development has focused on mass-production for large active matrix OLED devices in which pixels arranged on an OLED panel are individually driven to obtain high-quality images.

The LCD device and the OLED display device may include red, green, and blue color filters. The color filters may be formed on a different substrate than a thin film transistor ("TFT")-array substrate, on which TFTs are arranged, or they may be formed on the TFT-array substrate, which may improve aperture ratio and brightness. A structure in which the color filters and the TFTs are arranged on the same substrate is referred to as a color filter on array ("COA") structure.

The display device having only red, green, and blue sub-pixels may have low light efficiency and low brightness. Particularly, brightness may be lowered when displaying a white color. In order to improve light efficiency, a display device with red, green, blue, and white sub-pixels has been suggested.

However, when four sub-pixels are used in the display device with the COA structure, the remains or debris of color filters, which are not completely removed in the process for forming the red, green, and blue color filters, may remain in a white sub-pixel region. These color filter remains or debris may cause color mixture, leading to low light transmissivity and low brightness.

SUMMARY OF THE INVENTION

The present invention provides a display panel of a four sub-pixel structure with high light transmissivity and high brightness and a method for fabricating the same.

Additional features of the invention will be set forth in the description which follows, and in part will be apparent from the description, or may be learned by practice of the invention.

The present invention discloses a display device including a plurality of pixels, and each pixel includes a first sub-pixel, a second sub-pixel, a third sub-pixel, and a fourth sub-pixel. A thin film transistor is disposed in each sub-pixel. A first color filter is disposed adjacent to the thin film transistor in the first sub-pixel, a second color filter is disposed adjacent to the thin film transistor in the second sub-pixel, and a third color filter is disposed adjacent to the thin film transistor in the third sub-pixel. A planarization layer is disposed on the first color filter, the second color filter, and the third color filter, and a pixel electrode is connected to each thin film transistor. A color filter is not disposed in the fourth sub-pixel.

The present invention also discloses a method for fabricating a display device, including forming first, second, third, and fourth thin film transistors including first, second, third, and fourth drain electrodes, respectively, on a substrate, forming a passivation film on the first, second, third, and fourth thin film transistors, forming first, second, and third color filters in regions adjacent to the first, second, and third thin film transistors, respectively, forming a plurality of contact holes by etching the passivation film and color filter remains of a fourth sub-pixel region adjacent to the fourth thin film transistor to expose portions of the first, second, third, and fourth drain electrodes and to expose the fourth sub-pixel region, and forming first, second, third, and fourth pixel electrodes on the first color filter, the second color filter, the third color filter, and the fourth sub-pixel region, respectively.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

FIG. 3A, FIG. 3B, FIG. 3C, FIG. 3D, FIG. 3E, FIG. 3F, FIG. 3G, FIG. 3H, FIG. 3I, and FIG. 3J are cross-sectional views showing a process for fabricating a display device according to an exemplary embodiment of the present invention.

DETAILED DESCRIPTION OF THE ILLUSTRATED EMBODIMENTS

Figure 1:
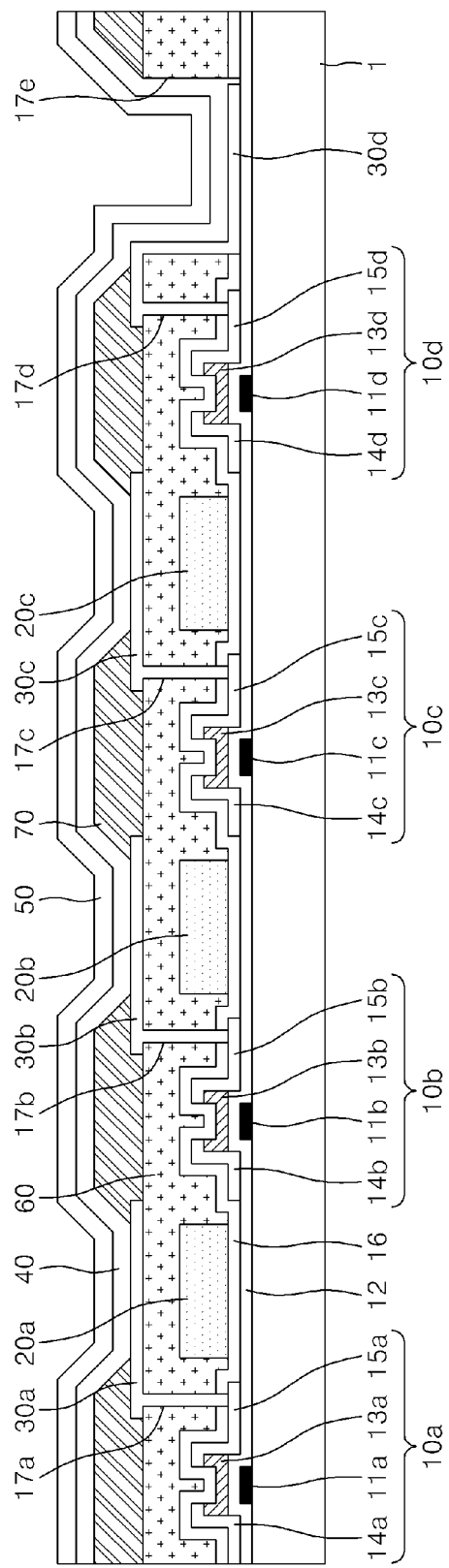
FIG. 1 is a cross-sectional view showing a display device according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative size of layers and regions may be exaggerated for clarity. Like reference numerals in the drawings denote like elements.

It will be understood that when an element such as a layer, film, region or substrate is referred to as being "on", "connected to", or "coupled to" another element or layer, it can be directly on, directly connected to, or directly coupled to the other element or layer, or intervening elements or layers may also be present. In contrast, when en element is referred to as being "directly on", "directly connected to", or "directly coupled to" another element or layer, there are no intervening elements or layers present.

FIG. 1 is a cross-sectional view showing a display device according to an exemplary embodiment of the present invention. FIG. 1 shows an example of a display device that may be used in an OLED display device. The display device of FIG. 1 includes a plurality of pixels, and each pixel includes a red, green, blue, and white sub-pixel. The red, green, and blue sub-pixels have the same structure except for colors of the color filters. Thus, of the red, green, and blue sub-pixels, only the structure of the red sub-pixel will be explained below.

The red sub-pixel includes a TFT, a color filter, a pixel electrode, an organic light-emitting layer, and a common electrode.

A first TFT 10*a* includes a gate electrode 11*a*, a gate insulating layer 12, an active layer 13*a*, a first source electrode 14*a*, a first drain electrode 15*a*, and a passivation film 16. The gate electrode 11*a* may be made of a metallic material. The gate insulating layer 12 may be made of an inorganic insulating material to insulate the gate electrode 11*a* from the active layer 13*a* and the first source and drain electrodes 14*a* and 15*a*. The active layer 13*a* includes a semiconductor layer, which may be made of amorphous silicon or poly silicon, and an ohmic contact layer arranged on the semiconductor layer to reduce a work function difference between the semiconductor layer and the first source and drain electrodes 14*a* and 15*a*. The ohmic contact layer may be formed of doped amorphous silicon or doped poly silicon. The passivation film 16 is formed over the entire surface of the substrate 1 to cover the active layer 13*a* and the first source and drain electrodes 14*a* and 15*a*. The passivation film 16 may be made of an inorganic insulating material.

The second TFT 10*b*, the third TFT 10*c*, and the fourth TFT 10*d* have the same structure as the first TFT 10*a*.

In addition to the driving TFT described above, a switching TFT and a capacitor (not shown) are also arranged in the display device of the OLED display device. The switching TFT is connected to the driving TFT and performs a switching operation for data signals applied to a data line (not shown). The driving TFT determines the amount of current flowing through an organic light-emitting layer based on the data signal transmitted through the switching TFT, i.e., a voltage difference between a gate electrode and a source electrode of the driving TFT. The capacitor serves to maintain the voltage difference between the gate electrode and the source electrode of the driving TFT for a period of time.

A red color filter 20*a* is formed on a portion of the passivation film 16 corresponding to a red sub-pixel region adjacent to the TFT 10*a*. The red color filter 20*a* may have a concavo-convex surface. If the pixel electrode is formed directly on the color filter, the pixel electrode will also have a concavo-convex surface. This may lead to a short circuit between the pixel electrode and the common electrode. Accordingly, a planarization film 60 is formed over the entire surface of the substrate 1 to cover the TFTs 10*a*, 10*b*, 10*c*, and 10*d* and the color filters 20*a*, 20*b*, and 20*c*. The planarization film 60 planarizes the substrate having the TFTs 10*a*, 10*b*, 10*c*, and 10*d* and the color filters 20*a*, 20*b*, and 20*c*, and it may be made of a transparent organic insulating material such as acrylate.

A first contact hole 17*a* penetrates portions of the passivation film 16 and the planarization film 60 to expose a portion of the first drain electrode 15*a*. A first pixel electrode 30*a* is formed on a portion of the planarization film 60 to be connected to the first drain electrode 15*a* via the first contact hole 17*a*. The first pixel electrode 30*a* overlaps the red color filter 20*a* and is wider than the red color filter 20*a*. Here, the first pixel electrode 30*a* serves as an anode.

A white sub-pixel includes the fourth TFT 10*d* and a fourth pixel electrode 30*d*. The fourth TFT 10*d* has substantially the same structure as the first TFT 10*a*, and therefore any repetitive description will be omitted.

Unlike the first pixel electrode 30*a*, the fourth pixel electrode 30*d* is formed on the gate insulating layer 12 without a color filter and the planarization film. Thus, only the gate insulating layer 12 is disposed between the fourth pixel electrode 30*d* and the substrate 1. The fourth pixel electrode 30*d* is connected to the fourth drain electrode 15*d* via the fourth contact hole 17*d*. If remains of the passivation film and the color filter do not exist between the fourth pixel electrode 30*d* and the substrate 1, color mixture may not occur and light transmissivity may be improved, leading to higher brightness.

An isolating wall 70 is formed on the planarization film 60 to cover the TFTs 10*a*, 10*b*, 10 *c*, and 10*d* and ends of the first to fourth pixel electrodes 30*a*, 30*b*, 30*c*, and 30*d* while exposing portions of the first to fourth pixel electrodes 30*a*, 30*b*, 30*c*, and 30*d* that correspond to light-emitting regions of the red, green, blue, and white sub-pixel regions, respectively. The isolating wall 70 serves to define light-emitting regions. That is, the isolating wall 70 forms four openings corresponding to the light-emitting regions. The isolating wall 70 may be made of an organic insulating material like the planarization film 60.

An organic light-emitting layer 40 is formed over the entire surface of the substrate 1 to cover at least the exposed portions of the first to fourth pixel electrodes 30*a*, 30*b*, 30*c*, and 30*d*. The organic light-emitting layer 40 may include a hole injecting layer, a hole transport layer, a light-emitting layer, an electron transport layer, and an electron injecting layer. The organic light-emitting layer 40 may have a multiple-layer structure in which two or more color material layers are stacked.

A common electrode 50 is formed over the entire surface of the substrate 1 to cover the organic light-emitting layer 40. The common electrode 50 may be made of an opaque metallic material having excellent reflectivity. Here, the common electrode 50 serves as a cathode and also serves to reflect light emitted from the organic light-emitting layer 40 toward the color filters 20*a*, 20*b*, and 20*c* and substrate 1.

Figure 2A:
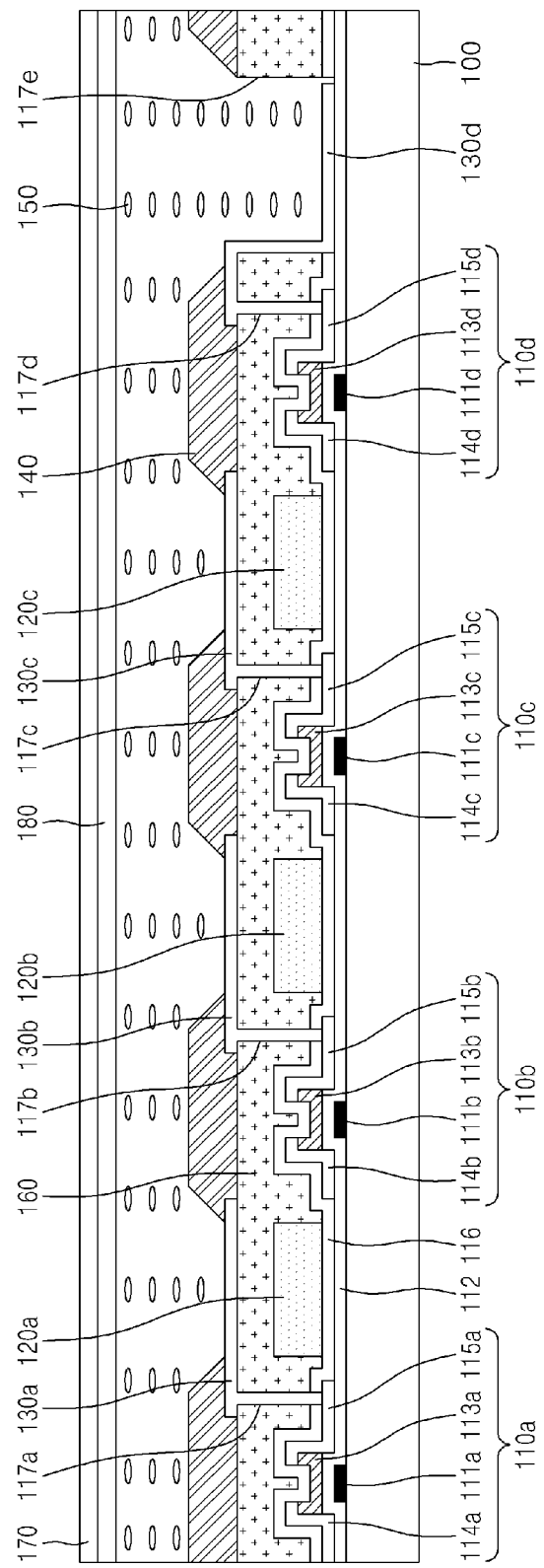
FIG. 2A and FIG. 2B are cross-sectional views showing a display panel according to another exemplary embodiment of the present invention.
Figure 2B:
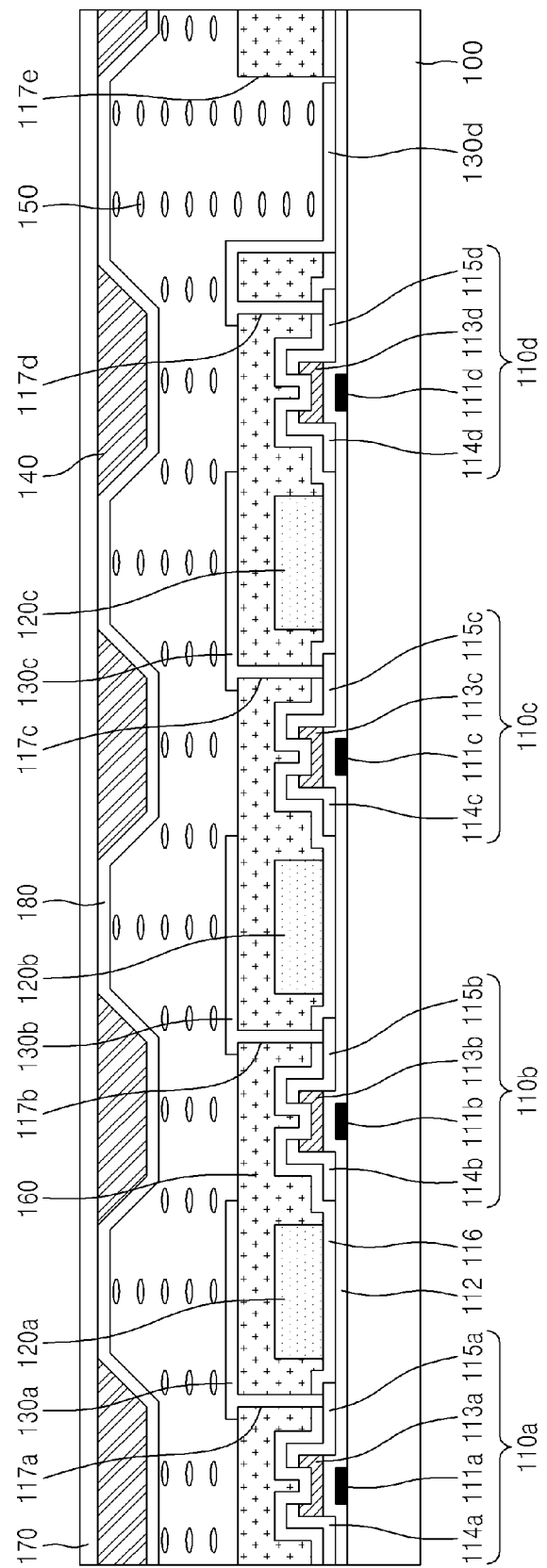

FIG. 2A and FIG. 2B are cross-sectional views showing a display panel according to another exemplary embodiment of the present invention.

Two types of display devices applied to an LCD device are described below with reference to FIG. 2A and FIG. 2B depending on a location of a black matrix.

FIG. 2A is a cross-sectional view showing a display panel of an LCD device in which a black matrix is arranged on a TFT array substrate according to an exemplary embodiment of the present invention. FIG. 2B is a cross-sectional view showing a display panel of an LCD device in which the black matrix is arranged on a common electrode substrate according to an exemplary embodiment of the present invention.

The display panels of FIG. 2A and FIG. 2B include a plurality of pixels, and each pixel includes red, green, blue, and white sub-pixels. The structure of the red, green, blue, and white sub-pixels is substantially the same as the structure of these sub-pixels described with reference to FIG. 1. Therefore, any repetitive description will be omitted.

Referring to FIG. 2A, a black matrix 140 is formed on a planarization film 160 to cover TFT regions and ends of the pixel electrodes 130a, 130b, 130c, and 130d while exposing portions of the pixel electrodes 130a, 130b, 130c, and 130d that correspond to light-emitting regions of the red, green, blue, and white sub-pixel regions, respectively. The black matrix 140 defines the light-emitting regions of the red, green, blue, and white sub-pixel regions and prevents light from leaking from one sub-pixel to another. Accordingly, the black matrix 140 is formed of an opaque material. A backlight module is arranged on a first substrate (or a TFT array substrate) 100 to irradiate light toward color filters 120a, 120b, and 120c and pixel electrode 130d. Thus, light passes through the color filters 120a, 120b, and 120c, the pixel electrode 130d, and an LC layer 150 and is then irradiated toward a common electrode 180. The black matrix 140 opens light-emitting regions of the sub-pixel regions in which the color filters 120a, 120b, and 120c and the pixel electrodes 130a, 130b, 130c, and 130d are formed and covers regions in which the TFTs 110a, 110b, 110c, and 110d are formed.

A second substrate (or a common electrode substrate) 170, on which the common electrode 180 is formed, is spaced apart from the first substrate 100 on which the black matrix 140 is formed. The common electrode 180 may be formed of a transparent material such as Indium Tin Oxide (ITO). The LC layer 150 is disposed between the first and second substrates 100 and 170.

Alternatively, as FIG. 2B shows, the black matrix 140 may be formed on the second substrate 170. The black matrix 140 is formed on the second substrate 170 to define light-emitting regions of the red, green, blue, and white sub-pixels, and the common electrode 180 is formed on the black matrix 140. The common electrode 180 may be formed of a transparent material. Here, the backlight module is arranged on the second substrate 170 to irradiate light toward the common electrode 180. Thus, light passes through the LC layer 150, the color filters 120a, 120b, and 120c, and pixel electrode 130d and then is irradiated toward the first substrate 100.

A method for fabricating a display device according to an exemplary embodiment of the present invention is explained below.

FIG. 3A, FIG. 3B, FIG. 3C, FIG. 3D, FIG. 3E, FIG. 3F, FIG. 3G, FIG. 3H, FIG. 3I, and FIG. 3J are cross-sectional views showing a process for fabricating a display device according to an exemplary embodiment of the present invention.

Figure 3A:
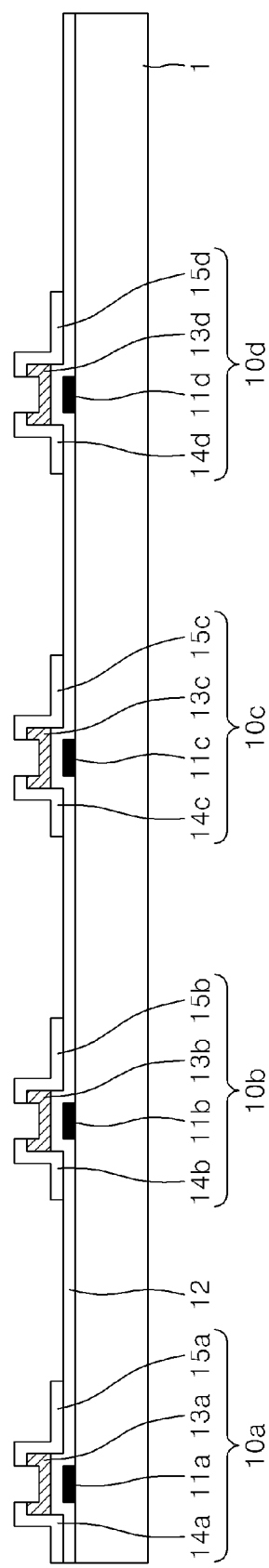

Referring to FIG. 3A, the first to fourth TFTs 10a, 10b, 10c, and 10d are formed on the substrate 1. The first to fourth TFTs 10a, 10b, 10c, and 10d include gate electrodes 11a, 11b, 11c, and 11d, respectively, a gate insulating layer 12, active layers 13a, 13b, 13c, and 13d, respectively, source electrodes 14a 14b, 14c, and 14d, respectively, and drain electrodes 15a, 15b, 15c, and 15d, respectively. Methods for forming TFTs are well known to a person of ordinary skill in the art and thus a description is omitted.

Figure 3B:
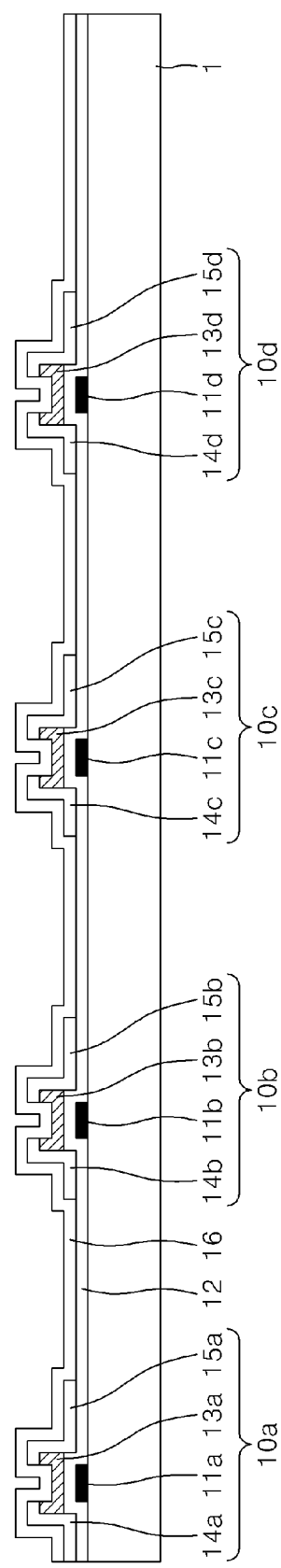

Referring to FIG. 3B, the passivation film 16 is formed over the entire surface of the substrate 1 to cover the first to fourth TFTs 10a, 10b, 10c, and 10d. The passivation film 16 may be made of an inorganic insulating material such as silicon nitride (SiNx).

Referring to FIG. 3C, the red, green, and blue color filters 20a, 20b, and 20c may be sequentially formed on portions of the passivation film 16. In more detail, a red color photo resist is first coated over the entire surface of the substrate 1. The red color photo resist is then patterned to form a red color resist pattern, i.e., the red color filter 20a, on a portion of the passivation film 16 adjacent to the first TFT 10a that corresponds to a light-emitting region of a red sub-pixel region. In the same way, the green and blue color filters 20b and 20c are formed on the corresponding portions of the passivation film 16. In this case, however, remains R of the color filters 20a, 20b, and 20c may remain on a portion of the passivation film 16 that corresponds to a white sub-pixel region W. The remains R in the white sub-pixel region W may cause color mixture and also lower light transmissivity. Conventionally, an ashing process may be performed to remove the color filter remains R. However, portions of the color filters may also be removed during the ashing process.

Figure 3D:
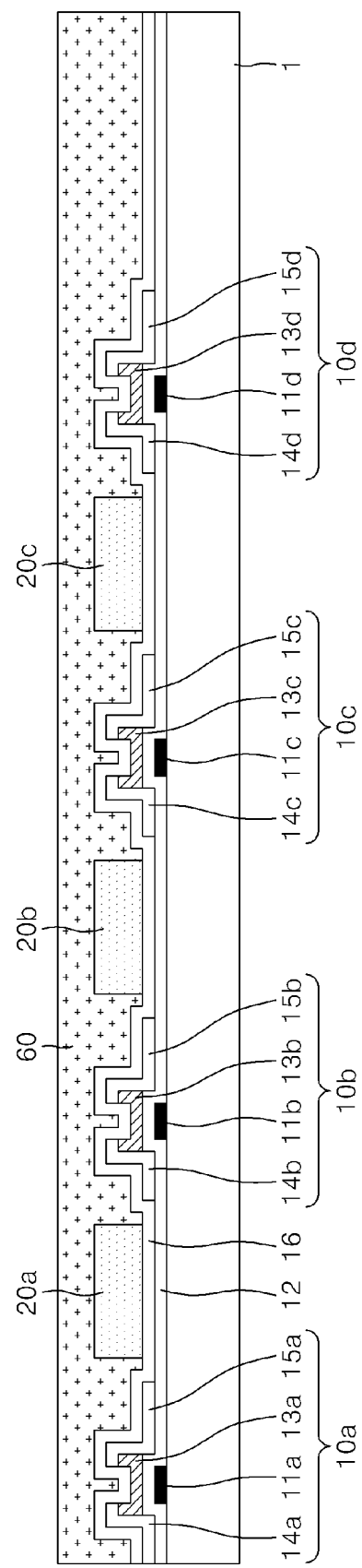

Thus, referring to FIG. 3D, rather than performing an ashing process, the planarization film 60 is formed over the entire surface of the substrate 1. The planarization film 60 may be made of a transparent organic insulating material. The planarization film 60 serves to prevent a short circuit between pixel electrodes and the common electrode. For example, the color filters may have a concavo-convex surface, and when the pixel electrodes are formed directly on the color filters, the pixel electrodes may also have a concavo-convex surface. The organic light-emitting layer is formed on the pixel electrodes. The pixel electrodes have a thickness of about 900 Å, and the organic light-emitting layer has a relatively thin thickness of about 200 Å. When the organic light-emitting layer is formed on the pixel electrodes having the concavo-convex surface, the pixel electrodes may partially penetrate the organic light-emitting layer. Thus, the pixel electrodes may be electrically connected to the common electrode, leading to a short circuit. Accordingly, the planarization film 60 may cover the concavo-convex surface of the color filters to provide for flatter pixel electrodes.

Then, the passivation film 16 and the planarization film 60 may be etched to form the first to fourth contact holes 17a, 17b, 17c, and 17d to expose portions of the first to fourth drain electrodes 15a, 15b, 15c, and 15d, respectively. At the same time, a fifth contact hole 17e may also be formed to expose a portion of the gate insulating layer 12 corresponding to the white sub-pixel region W. The process for forming the contact holes 17a, 17b, 17c, 17d, and 17e may include a sub-process for etching the planarization film 60 and a sub-process for etching the passivation film 16 and the color filter remains R.

Referring to FIG. 3E, in the sub-process for etching the planarization film 60, portions of the planarization film 60 are dry-etched to form the first to fifth contact holes 17a, 17b, 17c, 17d, and 17e. The fifth contact hole 17e is widely etched to expose the a portion of the white sub-pixel region W adjacent to the fourth TFT 10d.

Referring to FIG. 3F, in the sub-process for etching the passivation film 16 and the color filter remains R, the exposed portions of the passivation film 16 and the color filter remains R are dry-etched to expose the corresponding portions of the first to fourth drain electrodes 15a, 15b, 15c, and 15d and the corresponding portion of the gate insulating layer 12, thereby completing the first to fifth contact holes 17a, 17b, 17c, 17d, and 17e. Since the color filter remains R are composed of a color photo resist, the color filter remains R may be simultaneously removed in the process of etching the passivation film 16.

Here, the color filter remains R are removed in the state that the color filters 20a, 20b, and 20c are covered with the planarization film 60. Thus, the color filters 20a, 20b, and 20c do not get damaged. In addition, the portion of the passivation film 16 corresponding to the white sub-pixel region W is also removed, so that the light transmissivity may be improved, leading to higher brightness.

Alternatively, the first to fifth contact holes 17a, 17b, 17c, 17d, and 17e may be formed by a single dry etching process.

Subsequently, as shown in FIG. 3G, the first to fourth pixel electrodes 30a, 30b, 30c, and 30d are formed. The first pixel electrode 30a is formed on a portion of the planarization film 60 over the red color filter 20a to be connected to the first drain electrode 15a via the first contact hole 17a. The second pixel electrode 30b is formed on a portion of the planarization film 60 over the green color filter 20b to be connected to the second drain electrode 15b via the second contact hole 17b. The third pixel electrode 30c is formed on a portion of the planarization film 60 over the blue color filter 20c to be connected to the third drain electrode 15c via the third contact hole 17c. The fourth pixel electrode 30d is formed on a portion of the gate insulating layer 12 corresponding to the white sub-pixel region W to be connected to the fourth drain electrode 15d via the fourth contact hole 17d. The gate insulating layer 12 may have excellent flatness, and so even though the fourth pixel electrode 30d is not formed on the planarization film 60, a short circuit may not occur between the fourth pixel electrode 30d and the common electrode 50 (see FIG. 3J). Referring to FIG. 3H, the isolating wall 70 is formed on the planarization film 60 to cover the TFTs 10a, 10b, 10c, and 10d and ends of the first to fourth pixel electrodes 30a, 30b, 30c, and 30d while exposing portions of the first to fourth pixel electrodes 30a, 30b, 30c, and 30d that correspond to light-emitting regions of the red, green, blue, and white sub-pixel regions, respectively. The isolating wall 70 may be made of an organic insulating material like the planarization film 60.

Figure 3I:
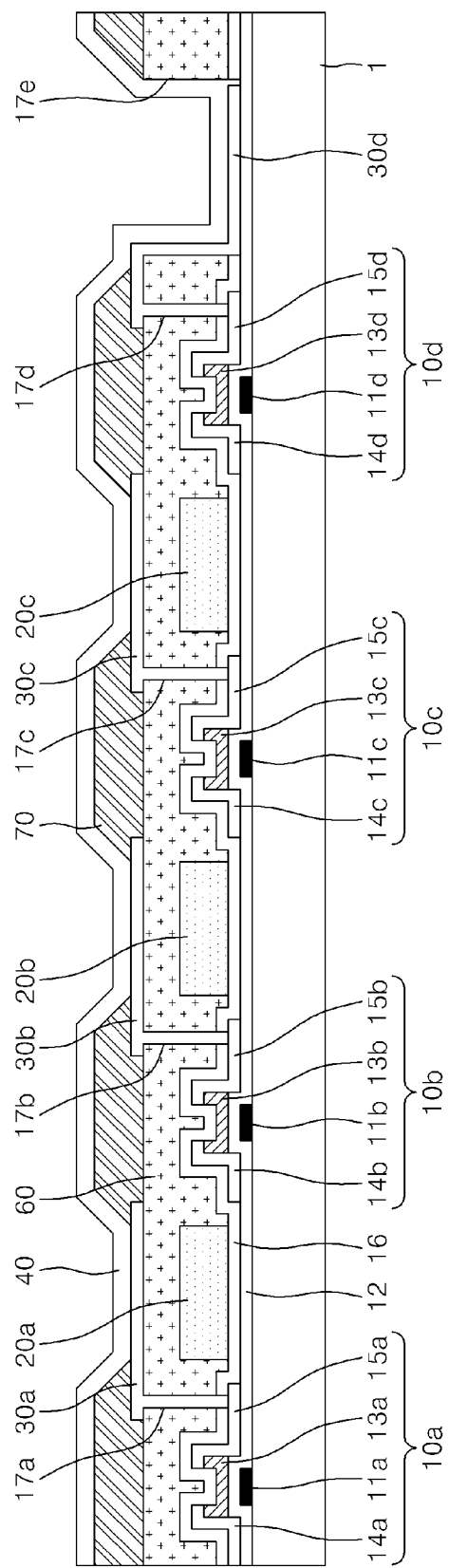
Figure 3J:
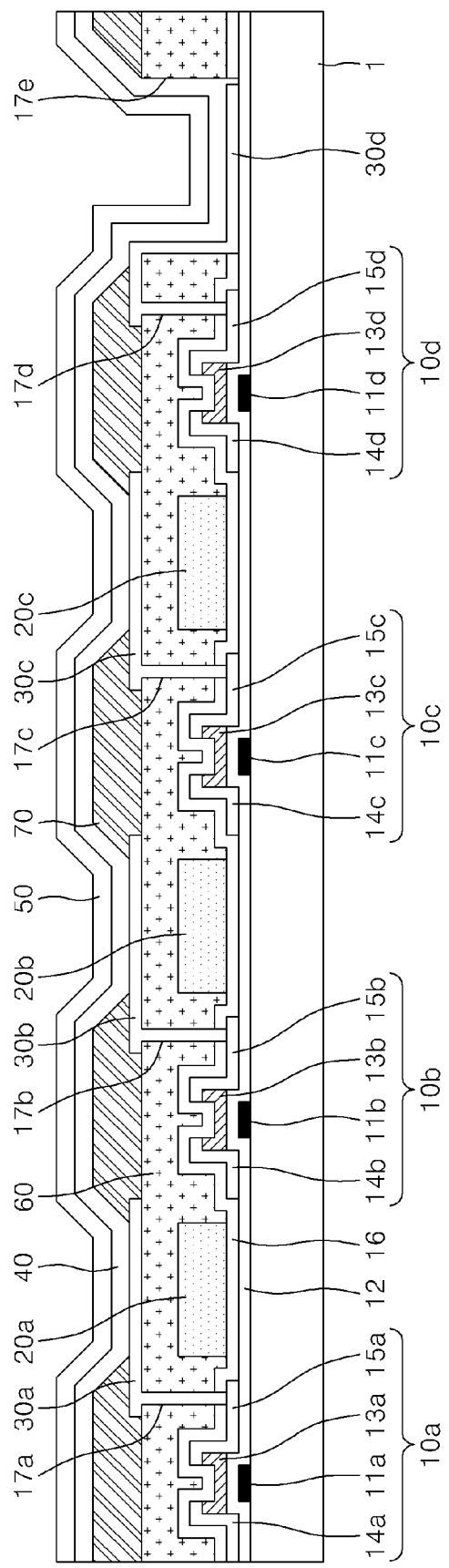

Referring to FIG. 3I, the organic light-emitting layer 40 is formed over the entire surface of the substrate 1 to cover at least the exposed portions of the first to fourth pixel electrodes 30a, 30b, 30c, and 30d. Finally, as shown in FIG. 3J, the common electrode 50 is formed over the entire surface of the substrate 1 to cover the organic light-emitting layer 40. The common electrode 50 may be made of an opaque conductive material having excellent reflectivity such as aluminum, barium, or calcium.

The above-described method for fabricating the display device is applied to an OLED display device. However, the display device concept of the present invention may also be applied to an LCD device.

For example, the black matrix may be formed instead of the isolating wall 70 in the state that the pixel electrodes 30a, 30b, 30c, and 30d are formed, as shown in FIG. 3G. The other processes of the display device applied to the LCD device may be substantially the same as the processes shown in FIGS. 3A to 3F. Thereafter, the common electrode substrate, on which the common electrode is arranged, is fabricated. The TFT array substrate and the common electrode substrate are bonded together, and the LC layer is disposed therebetween.

As described above, the display device according to exemplary embodiments of the present invention does not cause color mixture because the color filter remains in the white sub-pixel region may be completely removed, and also has improved light transmissivity, leading to higher brightness, because only the gate insulating layer exists between the pixel electrode and the substrate of the white sub-pixel region. Moreover, with a display device according to exemplary embodiments of the present invention, the color filter remains may be completely removed by altering a mask design for forming the contact holes without additional processes.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:
1. A display device, comprising:
a plurality of pixels, each pixel comprising a first sub-pixel, a second sub-pixel, a third sub-pixel, and a fourth sub-pixel;
a thin film transistor disposed in each sub-pixel;
a first color filter disposed in a first sub-pixel region adjacent to the thin film transistor in the first sub-pixel, a second color filter disposed in a second sub-pixel region adjacent to the thin film transistor in the second sub-pixel, and a third color filter disposed in a third sub-pixel region adjacent to the thin film transistor in the third sub-pixel;
a planarization layer disposed on the first color filter, the second color filter, and the third color filter; and
a pixel electrode connected to each thin film transistor,
wherein a color filter and the planarization layer are not disposed in a fourth sub-pixel region adjacent to the thin film transistor in the fourth sub-pixel.

2. The display device of claim 1, wherein the first, second, third, and fourth sub-pixels are red, green, blue, and white sub-pixels, respectively.

3. The display device of claim 2, wherein the thin film transistor disposed in each sub-pixel comprises a gate electrode, a gate insulating layer disposed on the gate electrode, a semiconductor layer disposed on the gate insulating layer, an ohmic contact layer disposed on the semiconductor layer, and a source electrode and a drain electrode disposed on the ohmic contact layer.

4. The display device of claim 3, wherein the pixel electrode of the fourth sub-pixel makes contact with the gate insulating layer.

5. The display device of claim 2, further comprising a passivation film formed on the thin film transistor disposed in each sub-pixel.

6. The display device of claim 2, further comprising a black matrix disposed on the planarization layer to cover the thin film transistor disposed in each pixel while exposing a portion of the pixel electrode.

7. The display device of claim 6, further comprising a liquid crystal layer disposed in each sub-pixel.

8. The display device of claim 7, further comprising a common electrode disposed on the liquid crystal layer.

9. The display device of claim 1, wherein each pixel electrode of the first, second and third sub-pixels, respectively, makes contact with the planarization layer.

10. The display device of claim 1, further comprising an isolating wall covering the thin film transistor disposed in each sub-pixel while exposing a portion of the pixel electrode.

11. The display device of claim 1, further comprising an organic light-emitting layer disposed in each sub-pixel.

12. The display device of claim 11, further comprising a common electrode disposed on the organic light-emitting layer.

13. A method for fabricating a display device, comprising:
forming first, second, third, and fourth thin film transistors including first, second, third, and fourth drain electrodes, respectively, on a substrate;
forming a passivation film on the first, second, third, and fourth thin film transistors;
forming first, second, and third color filters in first, second, and third sub-pixel regions adjacent to the first, second, and third thin film transistors, respectively;
forming a planarization layer on the first color filter, the second color filter, and the third color filter;
forming a plurality of contact holes by etching the passivation film, the planarization layer and color filter residue of a fourth sub-pixel region to expose portions of the first, second, third, and fourth drain electrodes and to expose the fourth sub-pixel region; and forming first, second, third, and fourth pixel electrodes in the first, second, third, and fourth sub-pixel regions, respectively, wherein the fourth sub-pixel region adjacent to the fourth thin film transistor does not include a color filter.

14. The method of claim 13, further comprising forming an isolating wall on ends of the pixel electrodes.

15. The method of claim 14, further comprising forming an organic light-emitting layer and a common electrode on the pixel electrodes.

16. The method of claim 13, further comprising forming a black matrix on the planarization layer.

17. The method of claim 16, further comprising forming a liquid crystal layer and a common electrode on the black matrix.

18. The method of claim 13, further comprising forming a gate insulating layer on a gate electrode of the thin film transistor, wherein the etching of the passivation film, the planarization layer, and color filter residue of the fourth sub-pixel region comprises exposing the gate insulating layer in the fourth sub-pixel region.

19. The method of claim 18, wherein forming the fourth pixel electrode on the fourth sub-pixel region comprises forming the fourth pixel electrode to contact the gate insulating layer in the fourth sub-pixel region.

20. A display device comprising:
a plurality of pixels, each pixel comprising a first sub-pixel including a first thin film transistor and a first sub-pixel region adjacent to the first thin film transistor, a second sub-pixel including a second thin film transistor and a second sub-pixel region adjacent to the second thin film transistor, a third sub-pixel including a third thin film transistor and a third sub-pixel region adjacent to the third thin film transistor, and a fourth sub-pixel including a fourth thin film transistor and a fourth sub-pixel region adjacent to the fourth thin film transistor;

a color filter disposed in each of the first sub-pixel region, the second sub-pixel region, and the third sub-pixel region and not disposed in the fourth sub-pixel region;

a planarization layer disposed on the color filters; and a pixel electrode connected to each thin film transistor and disposed in each sub-pixel region.

21. The display device of claim 20, further comprising a gate insulating layer on a gate electrode of each thin film transistor.

22. The display device of claim 21, wherein the pixel electrode in the fourth sub-pixel region makes contact with the gate insulating layer.

23. The display device of claim 20, wherein the planarization layer makes contact with the pixel electrode of the first sub-pixel region, the second sub-pixel region, and the third sub-pixel region.

24. A method of fabricating a display device, comprising:
preparing a substrate comprising a plurality of pixels, each pixel comprising a first sub-pixel including a first sub-pixel region, a second sub-pixel including a second sub-pixel region, a third sub-pixel including a third sub-pixel region, and a fourth sub-pixel including a fourth sub-pixel region;

forming a thin film transistor in each sub-pixel, adjacent to each sub-pixel region;

forming a color filter in each of the first sub-pixel region, the second sub-pixel region, and the third sub-pixel region;

forming a planarization layer on the color filters; and forming a pixel electrode in each sub-pixel region, the pixel electrode being connected to each thin film transistor, wherein the fourth sub-pixel region does not include the color filter.

25. The method of claim 24, further comprising:
forming a passivation film on the thin film transistor disposed in each sub-pixel; and forming a plurality of contact holes by etching the passivation film, the planarization layer and color filter residue of the fourth sub-pixel region to expose a portion of a drain electrode of each thin film transistor and to expose the fourth sub-pixel region.

* * * * *